United States Patent Office 3,471,291

Patented Oct. 7, 1969

3,471,291

PROTECTIVE PLATING OF OXIDE-FREE SILICON SURFACES

Donald L. Schaefer, Schenectady, N.Y., assignor to General Electric Company, a corporation of New York No Drawing. Filed May 29, 1967, Ser. No. 642,148
Int. Cl. G03c 5/00
U.S. Cl. 96—36.2 5 Claims

ABSTRACT OF THE DISCLOSURE

A method for sequentially removing an oxide film from the surface of an elemental silicon body and photoplating a layer of metal on the cleaned surface all in the same liquid solution, thereby preventing the formation of an oxide film between the surface of the silicon and the plated metal layer. Exposure of a silicon body immersed in a solution of silver fluoride and an alkali metal fluoride to activating radiation causes etching of silicon dioxide on the surface of the silicon body in the exposed areas and the plating out of silver metal on the exposed areas.

The invention herein described was made in the course of a contract with the Bureau of Ships, United States Navy.

Attention is drawn at this point to the patent application of Schaefer and Metlay, Ser. No. 604,603, filed Dec. 27, 1966, entitled "Oxide-Free Contacts to Silicon," assigned to the assignee of the present invention.

BACKGROUND OF THE INVENTION

In the manufacture of semiconductive devices utilizing silicon, it is customary to employ wafers of elemental silicon, usually in the form of disk-like bodies, frequently about one inch in diameter and about 0.1 inch or less in thickness. These wafers are treated in many ways in order to produce optimum semiconductive properties in the silicon and, not infrequently, it is desired to produce patterns in the silicon which have different electrical characteristics. After these patterns have been produced in the wafer, it is necessary to provide these pattern elements with electrical contacts. For example, one method which has been employed to produce a pattern in a silicon wafer is to uniformly oxidize the surface to be treated to produce a uniform layer of $SiO_2$ thereover. A conventional photoresist copy of the pattern is then developed on the oxide surface which comprises soluble zones in the photoresist material overlying zones of the oxide corresponding to the desired pattern and insoluble zones overlying zones of the oxide which are not to be treated. The soluble material is removed and the exposed oxide in the zones of the pattern is then removed with hydrofluoric acid, exposing the underlying silicon which is not attacked by the acid. The pattern in the exposed silicon is then treated as desired such as for example, by diffusing a doping agent therein, and conducting electrodes applied to the pattern by suitably masking portions of the pattern and evaporating gold, for example, onto the areas of the pattern where contacts are desired. The unwanted photoresist pattern, masks, and silica may then be removed in preparation for subsequent treatment if desired. Unless considerable care is taken, the exposed surface of the silicon in the zones where the $SiO_2$ film is removed to form the pattern will become contaminated by atmospheric oxygen to form an oxide layer up to 50 A. thick before the contacts can be applied which is a highly undesirable occurrence.

It is therefore a principal object of this invention to prevent the formation of an oxide film on the exposed surfaces of such silicon bodies prior to the application of electrical contacts thereto.

It is a further object of this invention to provide a method for sequentially removing silica from the surface of a silicon body and applying a metallic plate or layer on predetermined areas of the oxide-free surface while preventing the formation of a new oxide layer before and during the plating operation.

It is a yet further object of this invention to deposit metallic electrode contacts on the surface of oxide-free silicon following the photodecomposition of a compound which produces an etchant for the oxide of silicon.

Other and specifically different objects of the invention will become apparent to those skilled in the art from the description which follows.

SUMMARY OF THE INVENTION

Briefly stated, and in accordance with one aspect of the invention, an oxidized silicon wafer is immersed in a solution containing a photodecomposable inorganic fluoride and a source of silver ions which upon exposure to activating radiation produces chemically reactive species which attack and etch silicon dioxide in areas of the surface which are illuminated. When the silicon dioxide has been removed from an illuminated area by the etching reaction, the silver ions plate the exposed elemental silicon surface with a continuous film of metallic silver which, when the wafer is removed from the etching solution and exposed to atmospheric air prevents the formation of new, undesirable silicon dioxide films on the etched silicon surfaces.

DESCRIPTION OF THE PREFERRED EMBODIMENT

More specifically, the following working example of the invention will clearly demonstrate how the invention may be practiced.

Example 1

A silicon wafer about one inch in diameter having a surface oxide film of about 6000 A. in thickness was immersed in a solution containing about 0.1 molar silver fluoride and about 0.1 molar sodium fluoride in methanol and the liquid to solid interface between the solution and the silicon dioxide layer exposed to a pattern of illumination from a high intensity xenon lamp. Photodecomposition of the silver fluoride caused the silicon dioxide to be etched in the illuminated areas of the pattern. When the oxide layer was etched through to the silicon substrate, a continuous film of silver was deposited upon the exposed silicon surface, thereby providing a silver contact upon the clean surface without exposing the silicon surface to contamination by atmospheric oxygen.

Example 2

The procedure of Example 1 was repeated except that water was substituted for the methanol and the same results were obtained.

From the foregoing, it will be apparent to those skilled in the art that other variations may be made within the scope of the invention, such as, for example, the substitution of other strong alkali fluorides such as potassium fluoride, and other solvents such as ethanol or mixtures of water and alcohol or alcohols, all within the scope of the invention. It is therefore not intended to limit the invention except as defined by the following claims.

What I claim as new and desire to secure by Letters Patent of the United States is:

1. The method of plating electrically conductive coherent silver films upon silicon substrates comprising the steps of contacting the oxidized surface of said substrate to be plated upon with a solution of silver fluoride and a strong alkali fluoride to form a common interface, illuminating selected areas of said interface with activating radiation whereby chemically reactive species are produced at said interface which chemically attack said oxide surface and etch it in the illuminated areas, and when said oxide is removed from said substrate in said illuminated areas, an electrically conductive coherent silver film is produced upon the clean and uncontaminated surface of said substrate in said areas.

2. The method of claim 1 wherein said strong alkali fluoride is sodium fluoride.

3. The method of claim 1 wherein said solution of fluorides is an aqueous solution.

4. The method of claim 1 wherein said solution of fluorides is an alcoholic solution.

5. The method of claim 4 wherein said alcohol is methanol.

References Cited

UNITED STATES PATENTS

| | | | |
|---|---|---|---|
| 1,560,240 | 11/1925 | Jelley | 96—94 |
| 2,841,477 | 7/1958 | Hall | 204—157.1 X |
| 2,875,046 | 2/1959 | Marrow et al. | 96—36 X |
| 3,013,955 | 12/1961 | Roberts | 117—93.3 X |
| 3,122,463 | 2/1964 | Ligenza et al. | 156—4 |

FOREIGN PATENTS

| | | |
|---|---|---|
| 547,806 | 9/1942 | Great Britain. |

GEORGE F. LESMES, Primary Examiner

R. E. MARTIN, Assistant Examiner

U.S. Cl. X.R.

117—93.3; 148—6.14; 156—4, 17